(12) United States Patent
Sohn et al.

(10) Patent No.: US 12,362,194 B2
(45) Date of Patent: Jul. 15, 2025

(54) RAPID THERMAL PROCESSING SYSTEM WITH COOLING SYSTEM

(71) Applicants: Beijing E-Town Semiconductor Technology Co., Ltd., Beijing (CN); Mattson Technology, Inc., Fremont, CA (US)

(72) Inventors: Manuel Sohn, Neu-Ulm (DE); Rolf Bremensdorfer, Bibertal (DE); Silke Hamm, Laupheim (DE); Dieter Hezler, Lonsee-Halzhausen (DE)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 342 days.

(21) Appl. No.: 17/405,142

(22) Filed: Aug. 18, 2021

(65) Prior Publication Data
US 2022/0059363 A1    Feb. 24, 2022

Related U.S. Application Data

(60) Provisional application No. 63/066,856, filed on Aug. 18, 2020.

(51) Int. Cl.
*H01L 21/67* (2006.01)
*H01L 21/324* (2006.01)
*H01L 21/66* (2006.01)

(52) U.S. Cl.
CPC ...... *H01L 21/324* (2013.01); *H01L 21/67115* (2013.01); *H01L 22/26* (2013.01)

(58) Field of Classification Search
CPC ............. H01L 21/324; H01L 21/67109; H01L 21/67248; H01L 21/67115; H01L 22/26; F27B 17/0025; Y02P 10/25; F27D 19/00
See application file for complete search history.

(56) References Cited

U.S. PATENT DOCUMENTS 6,812,157 B1 * 11/2004 Gadgil ............. C23C 16/45578
117/88
7,977,258 B2    7/2011 Nenyei et al.
(Continued)

FOREIGN PATENT DOCUMENTS

CN    101645393    *    2/2010    ........... H01L 21/324
CN    208767255    *    4/2019    ............. H01J 37/32
(Continued)

OTHER PUBLICATIONS

International Search Report and Written Opinion Corresponding to Application No. PCT/US2021/046275 on Dec. 6, 2021. (15 pages).

*Primary Examiner* — Mary A Wilczewski
(74) *Attorney, Agent, or Firm* — Dority & Manning, P.A.

(57) ABSTRACT

Apparatus, systems, and methods for processing workpieces are provided. In one example, such a method for performing a spike anneal rapid thermal process may include controlling a heat source to begin heating a workpiece supported on a workpiece support in a processing chamber. The method may further include receiving data indicative of a temperature of the workpiece. Furthermore, the method may include monitoring the temperature of the workpiece relative to a temperature setpoint. Moreover, the method may include controlling the heat source to stop heating the workpiece based at least in part on the workpiece reaching the temperature setpoint. Additionally, the method may include controlling a cooling system to begin flowing a cooling gas at a rate of about 300 slm or greater over the workpiece based at least in part on the workpiece reaching the temperature setpoint to reduce a t50 peak width of the workpiece.

13 Claims, 8 Drawing Sheets

(56) References Cited

U.S. PATENT DOCUMENTS

| | | | |
|---|---|---|---|
| 9,587,312 B2* | 3/2017 | Silva | C23C 16/45574 |
| 9,758,870 B2 | 9/2017 | Je et al. | |
| 10,266,385 B2* | 4/2019 | Lee | F28D 7/02 |
| 11,225,716 B2* | 1/2022 | Verbaas | C23C 16/4586 |
| 12,068,177 B2* | 8/2024 | Sohn | H01L 21/67248 |
| 2002/0067918 A1 | 6/2002 | Camm et al. | |
| 2003/0049372 A1* | 3/2003 | Cook | C23C 16/45574 |
| | | | 118/724 |
| 2004/0058560 A1 | 3/2004 | Ranish et al. | |
| 2006/0021574 A1* | 2/2006 | Armour | C23C 16/45574 |
| | | | 427/248.1 |
| 2006/0062900 A1* | 3/2006 | Selvamanickam | |
| | | | H10N 60/0464 |
| | | | 427/248.1 |
| 2006/0127067 A1 | 6/2006 | Wintenberger et al. | |
| 2010/0008656 A1 | 1/2010 | Sorabji et al. | |
| 2010/0236483 A1* | 9/2010 | Liu | C23C 16/45589 |
| | | | 118/730 |
| 2010/0252547 A1 | 10/2010 | Timans | |
| 2013/0206362 A1 | 8/2013 | Li et al. | |
| 2017/0191759 A1 | 7/2017 | Pfahler et al. | |
| 2019/0333788 A1 | 10/2019 | Lee et al. | |
| 2020/0321193 A1* | 10/2020 | Ni | H01L 21/67069 |
| 2021/0156029 A1* | 5/2021 | Verbaas | C23C 16/46 |
| 2021/0257235 A1* | 8/2021 | Kaneko | H01L 21/67109 |
| 2022/0029371 A1* | 1/2022 | De Cloet | H01R 43/05 |
| 2022/0059363 A1* | 2/2022 | Sohn | F27D 19/00 |
| 2023/0060692 A1* | 3/2023 | Chen | H01L 21/67248 |

FOREIGN PATENT DOCUMENTS

| | | | | |
|---|---|---|---|---|
| EP | 1 610 363 | * | 12/2005 | H01L 21/67109 |
| KR | 10-0297285 | * | 10/2001 | H01L 21/324 |
| KR | 10-2010-0087401 | * | 8/2010 | H01L 21/67248 |
| WO | WO 2018232159 | | 12/2018 | |
| WO | WO2021045587 A1 | | 3/2021 | |
| WO | WO2021049283 A1 | | 3/2021 | |

* cited by examiner

RAPID THERMAL PROCESSING SYSTEM WITH COOLING SYSTEM

PRIORITY CLAIM

The present application claims the benefit of priority of U.S. Provisional Application Ser. No. 63/066,856, titled "Rapid Thermal Processing System with Cooling System," filed on Aug. 18, 2020, which is incorporated herein by reference.

FIELD

The present disclosure relates generally to thermal processing systems, and more to particularly rapid thermal processing systems having a cooling system.

BACKGROUND

A thermal processing chamber as used herein refers to a system that heats workpieces, such as semiconductor workpieces (e.g., semiconductor wafers). Such systems can include a support plate for supporting one or more workpieces and an energy source for heating the workpieces, such as heating lamps, lasers, or other heat sources. During heat treatment, the workpiece(s) can be heated under controlled conditions according to a processing regime.

Many thermal treatment processes require a workpiece to be heated over a range of temperatures so that various chemical and physical transformations can take place as the workpiece is fabricated into a device(s). During rapid thermal processing, for instance, workpieces can be heated by an array of lamps through the support plate to temperatures from about 300° C. to about 1,200° C. over time durations that are typically less than a few minutes.

SUMMARY

Aspects and advantages of embodiments of the present disclosure will be set forth in part in the following description, or may be learned from the description, or may be learned through practice of the embodiments.

One example aspect of the present disclosure is directed to a thermal processing system for performing rapid thermal processing of semiconductor workpieces. The system includes a processing chamber and a workpiece support configured to support a workpiece within the processing chamber. The system further includes a heat source configured to heat the workpiece and a temperature measurement system configured to generate data indicative of a temperature of the workpiece. Additionally, the system includes a cooling system configured to flow a cooling gas over the workpiece supported on the workpiece support, the cooling system comprising a plurality of cooling tubes arranged in a cooling plane, each cooling tube of the plurality of cooling tubes having an inlet opening and a plurality of outlet openings.

Other example aspects of the present disclosure are directed to systems, methods, devices, and processes for performing rapid thermal processing of semiconductor workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to thermal processing systems, such as rapid thermal processing (RTP) systems, for workpieces, such as semiconductor workpieces (e.g., silicon workpieces). In particular, example aspects of the present disclose are directed to more tightly controlling a temperature profile during a thermal treatment process, such as a spike anneal process. A spike anneal process can be a thermal process which heats workpieces to high temperatures on a timescale of several seconds or less. Spike anneal processes can be used, for instance, to activate dopants in a workpiece such as a silicon wafer.

At high temperatures, dopant atoms can diffuse into the workpiece at high rates, with most of the diffusion occurring at peak annealing temperatures required to activate dopants. With increasing performance demands and decreasing device sizes in semiconductor device manufacturing, it can be desirable to tightly control a spike anneal heating profile as precisely as possible to subject the workpiece to temperature conditions which serve to activate the dopants while, at the same time, limiting diffusion of the dopants.

According to example aspects of the present disclosure, a cooling system can be disposed proximate a workpiece (e.g., a semiconductor material or wafer) configured to be heated by light emitted by one or more heat sources (e.g., lamp heat source(s), laser(s), or any other suitable light source). The cooling system can be configured to supply a flow of cooling gas over the workpiece to increase the cooling rate of the workpiece. In some embodiments, the cooling system can provide a flow of cooling gas into the processing chamber at a rate of about 300 slm or greater to reduce a t50 peak width of a workpiece during a thermal treatment process.

More particularly, in some example aspects, the cooling system has a plurality of cooling tubes arranged in a cooling plane, each cooling tube having an inlet opening and a plurality of outlet openings. In some example aspects, the plurality of cooling tubes includes exactly four cooling tubes. In one aspect, directly adjacent ones of the four cooling tubes are positioned perpendicular to each other. The cooling plane may, in some example aspects, be parallel to a workpiece plane of the workpiece. Moreover, in some example aspects, the plurality of cooling tubes may be spaced apart from a central axis of the workpiece. Additionally, the plurality of cooling tubes may, in some example aspects, extend radially towards such central axis of the workpiece.

In some example aspects, a gas supply is coupled to the inlet openings of the plurality of cooling tubes to provide the cooling gas from a gas source through the plurality of cooling tubes and out the plurality of outlet openings of the plurality of cooling tubes. In some example aspects, an axis of each of the plurality of outlet openings of the plurality of cooling tubes is angled relative to the cooling plane towards the workpiece plane of the workpiece. Moreover, in some example aspects, the plurality of outlet openings of the plurality of cooling tubes are radially spaced apart from the central axis of the workpiece. For instance, in one aspect, each of the plurality of outlet openings of the plurality of cooling tubes is at a different radial distance from the central axis of the workpiece. Particularly, in one aspect, the radial distance between adjacent ones of the plurality of outlet openings of each of the plurality of cooling tubes decreases with increasing radial distance from the central axis of the workpiece. Additionally, in one aspect, each of the plurality of outlet openings of the four cooling tubes has a same cross-sectional area.

In some example aspects, the plurality of cooling tubes are comprised of quartz material. As such, the cooling tubes may be fire polished to reduce the amount of debris generated during the thermal process, which may otherwise contaminate the workpiece.

In some embodiments, the controllable cooling system can be used in a thermal processing system to reduce a peak width associated with a thermal treatment process (e.g., a spike anneal process). The peak width can describe a time interval when a workpiece can be at or above a reference temperature that can be obtained from subtracting a temperature value (e.g., 50K, etc.) from a peak temperature ($T_{peak}$) of a temperature time profile (e.g., a spike anneal heating profile). For instance, a 50° temperature peak width (t50 peak width) is defined as a time interval where a temperature of a surface of the workpiece is above ($T_{peak}$-50°). The reduced peak width obtained using thermal processing according to example aspects of the present disclosure can allow the thermal processing to achieve effective annealing cycles at relatively high temperatures while still reducing undesirable processes, such as excessive dopant diffusion. In some aspects, a temperature measurement system may be configured to generate the data indicative of the temperature of the workpiece.

In some embodiments, the thermal processing system can include a controller (e.g. one or more control devices) to control an operation (e.g., flow rate) of the cooling system during the thermal process to reduce a peak width associated with the thermal treatment process. For instance, the controller can control the operation of the cooling system to flow a cooling gas at a rate of supply of about 300 standard liters per minute (slm) or greater over the workpiece to reduce a t50 peak width of the workpiece, such that the thermal treatment process has a t50 peak width of about 1.8 seconds or less. Additionally, the controller may be configured to control the workpiece support to rotate the workpiece at least while the cooling system flows the cooling gas over the workpiece.

In some embodiments, the controller (e.g., a computer, microcontroller(s), other control device(s), etc.) can include one or more processors and one or more memory devices. The one or more memory devices can store computer-readable instructions that when executed by the one or more processors cause the one or more processors to perform operations, such as control an operation of the cooling system during the thermal process, or other suitable operation as described below.

One example aspect of the present disclosure is directed to a method for controlling operation of a thermal processing system. The method can include activating a heat source(s) to emit light to heat a workpiece for a spike anneal process. The method can include obtaining data indicative of a temperature of a workpiece during the spike anneal heating process. The method can further include monitoring the temperature of the workpiece relative to a temperature setpoint. Moreover, the method can include controlling the heat source to stop heating the workpiece based at least in part on the workpiece reaching the temperature setpoint. Additionally, the method can include controlling the cooling system having a plurality of cooling tubes arranged in a cooling plane, each cooling tube having an inlet opening and a plurality of outlet openings, to begin flowing a cooling gas at a rate of about 300 slm or greater over the workpiece based at least in part on the workpiece reaching the temperature setpoint to reduce a t50 peak width of the workpiece.

Another example aspect of the present disclosure is directed to a method for controlling operation of a thermal processing system. The method can include activating a heat source(s) to emit light to heat a workpiece for a spike anneal process. The method can include determining expiration of a time interval subsequent to activating the heat source(s) during the spike anneal process. The method can include upon the expiration of the time interval, controlling the heat source to stop heating the workpiece and controlling the cooling system having a plurality of cooling tubes arranged in a cooling plane, each cooling tube having an inlet opening and a plurality of outlet openings, to begin flowing a cooling gas at a rate of about 300 slm or greater over the workpiece to reduce a t50 peak width of the workpiece.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value.

Figure 1:
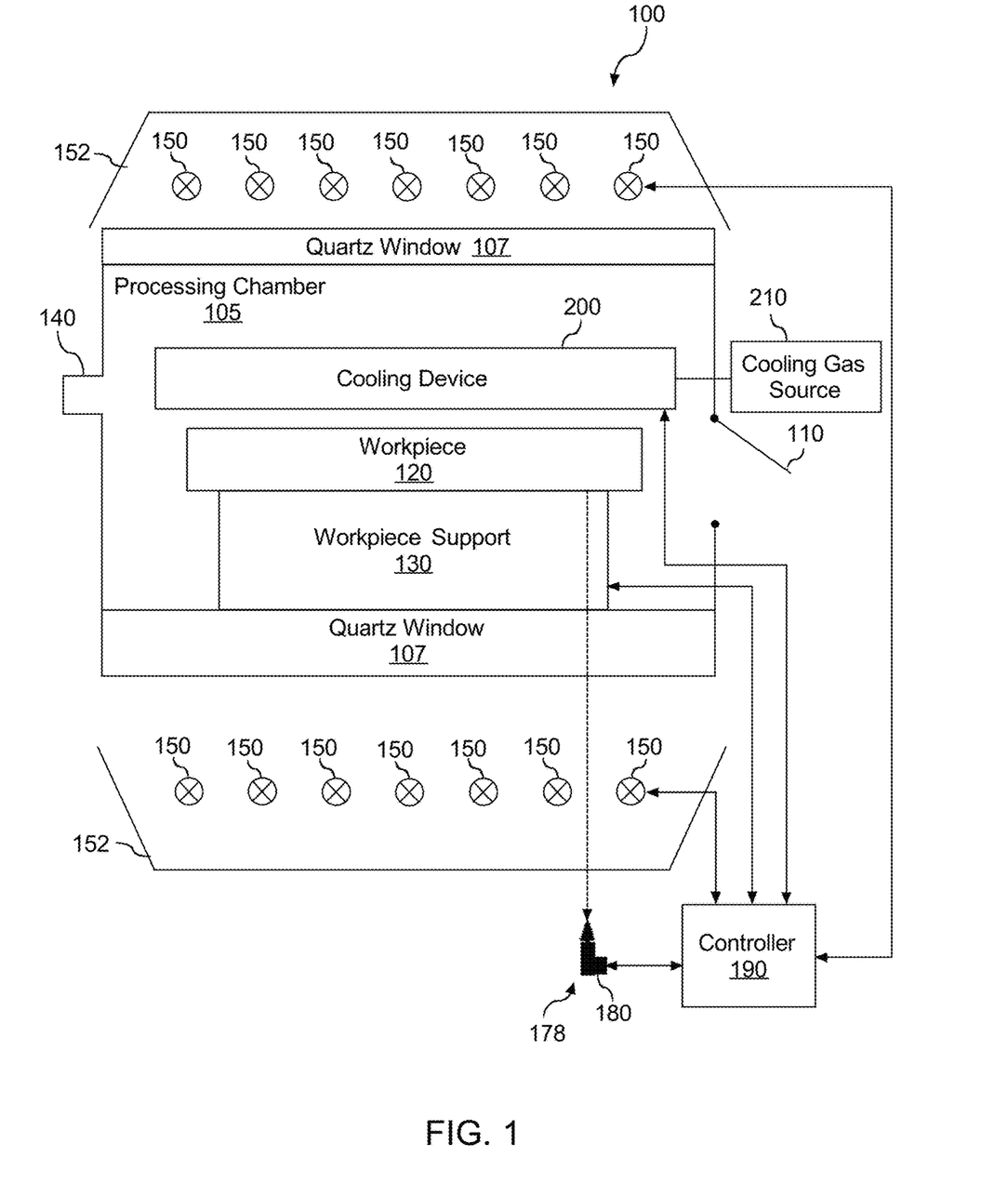
FIG. 1 depicts a rapid thermal processing system according to example embodiments of the present disclosure.

Referring now to the figures, FIG. 1 depicts a thermal processing system 100 according to example embodiments of the present disclosure. As shown, the thermal processing system 100 can include a processing chamber 105. In some implementations, the processing chamber 105 can be defined, at least in part, by quartz windows 107 of the thermal processing system 100. For instance, one of the quartz windows 107 may at least partially define a ceiling of the processing chamber 105 and another of the quartz windows 107 may at least partially define a floor or bottom surface of the processing chamber 105. In some implementations, the quartz windows 107 can be doped with hydroxide OH. It should be appreciated that the one or more surfaces defining the processing chamber 105 can be formed from any suitable material. For instance, in some implementations, the one or more surfaces defining the processing chamber 105 can be formed from quartz.

As shown, the thermal processing system 100 can include a door 110 movable between an open position (FIG. 1) and a closed position (not shown) to permit selective access to the processing chamber 105. For instance, the door 110 can be moved to the open position to allow a workpiece 120 to be positioned within the processing chamber 105. In some implementations, the workpiece 120 can be supported, at least in part, by a workpiece support 130 configured to support the workpiece 120. In this manner, heat associated with emitting light onto the lower quartz window 170 can be at least partially transferred to the workpiece 120 via the workpiece support 130. In some embodiments, the workpiece support 130 may be configured to rotate the workpiece 120 during a thermal treatment process. For instance, in some instances, the workpiece support 130 is rotatable. Furthermore, the door 110 can be moved to the closed position once the workpiece 120 is disposed on the workpiece support 130. In some implementations, the processing chamber 105 can be sealed off from an external environment when the door 110 is in the closed position.

In some implementations, the one or more surfaces defining the processing chamber 105 can define a gas inlet port 140. In this manner, a process gas provided from a gas source can flow into the processing chamber 105 via the gas inlet port 140. In some implementations, the process gas can include an inert gas that does not react with the workpiece 120. Alternatively, the process gas can include a reactive gas that reacts with workpiece 120 to deposit a layer of material on the surface of the workpiece 120. For instance, in some implementations, the process gas can include ammonium $NH_3$ gas. It should be appreciated, however, that the process gas can include any suitable reactive gas. For instance, in alternative implementations, the reactive gas can include $H_2$ gas.

The thermal processing system 100 can include one or more heat sources 150 configured to heat the workpiece 120. The heat sources 150 can be disposed outside of the processing chamber 105. For instance, the heat sources 150 may be positioned above the processing chamber 105, below the processing chamber 105, or both above and below the processing chamber 105. The one or more heat sources 150 can be configured to emit light towards the workpiece 120 during a thermal treatment process, such as a rapid thermal treatment, or a spike anneal process. More particularly, the heat sources 150 positioned above the processing chamber 105 may be configured to emit light towards an upper surface or side of the workpiece 120 and the heat sources 150 positioned below the processing chamber 105 may be configured to emit light towards a lower surface or side of the workpiece 120 during a thermal treatment process. The light emitted from the one or more heat sources 150 can raise a temperature of the workpiece 120. In some implementations, the one or more heat sources 150 can increase the temperature of the workpiece 120 by greater than about 500° C. within a predetermined amount of time (e.g., less than 2 seconds).

It should be appreciated that the one or more heat sources 150 can include any suitable type of heat source configured to emit light. For instance, in some implementations, the one or more heat sources 150 can include one or more heat lamps (e.g., linear lamps). In alternative implementations, the one or more heat sources 150 can include one or more lasers configured to emit a laser beam onto the workpiece 120. It should further be appreciated that the heat sources 150 positioned above the processing chamber 105 may be controlled separately from the heat sources 150 positioned below the processing chamber 105 or may be controlled together for performing a thermal treatment process.

In some implementations, the thermal processing system 100 can include one or more reflectors 152 positioned such that the light emitted from the one or more heat sources 150 is directed to or towards the processing chamber 105. More specifically, the reflectors 152 can direct the light emitted from the one or more heat sources 150 to or towards the respective quartz window 107 such that the light can pass through the respective quartz window 107 and into the processing chamber 105. It should be appreciated that at least a portion of the light entering the processing chamber 105 via the quartz window(s) 107 can be emitted onto the workpiece 120. In this manner, the light emitted from the one or more heat sources 150 can, as discussed above, raise the temperature of the workpiece 120 during a thermal treatment process, such as a rapid thermal treatment process (e.g., spike anneal treatment).

In one implementation, the thermal processing system 100 can include a temperature measurement system 178 configured to generate and communicate data indicative of a temperature of the workpiece 120. The temperature measurement system 178 may include one or more temperature sensors 180. The temperature sensor(s) 180 may comprise pyrometer(s), thermocouple(s), thermistor(s), or any other suitable temperature sensor or combination of temperature sensors. The temperature sensor(s) 180 may be positioned within the processing chamber 105 or may be positioned exterior to the processing chamber 105, depending on the type of sensor. For example, if the temperature sensor(s) 180 is a pyrometer, the pyrometer does not need to contact the workpiece 120, and thus, may be positioned exterior to the chamber 105. However, if the temperature sensor(s) 180 is a thermocouple, the thermocouple must be in contact with the workpiece 120, and thus, may be positioned interior to the chamber 105. Further, the temperature sensor(s) 180 may be communicatively coupled to a controller 190, by a wired connection, a wireless connection, or both, such that the data generated by the sensor(s) 180 indicative of the temperature of the workpiece 120 may be provided to the controller 190.

According to example aspects of the present disclosure, the thermal processing system 100 includes a cooling system 200, as will be described below in greater detail, configured to flow cooling gas from a gas source across the workpiece 120 during a thermal process. The controller 190 can control an operation of the heat source(s) 150 and the cooling system 200 (e.g., change a rate of supply of cooling gas across the workpiece 120) during a thermal process to reduce a peak width associated with a thermal treatment process. For instance, the controller 190 can control the operation of the cooling system 200 such that the thermal treatment process has a t50 peak width of about 1.8 seconds or less, such as about 1.5 seconds or less. Additionally, the controller 190 can control an operation of the workpiece support 130 to rotate the workpiece 120. For instance, the controller 190 can control the operation of the workpiece support 130 to rotate the workpiece 120 during a thermal treatment process, such as at least during the operation of the cooling system 200.

In some embodiments, the controller 190 (e.g., a computer, microcontroller(s), other control device(s), etc.) can include one or more processors and one or more memory devices. The one or more memory devices can store computer-readable instructions that when executed by the one or more processors cause the one or more processors to perform operations, such as turning on or turning off the heat source(s) 150, controlling an operation of the cooling system 200 during the thermal process, or other suitable operation as will be described below.

Figure 2:
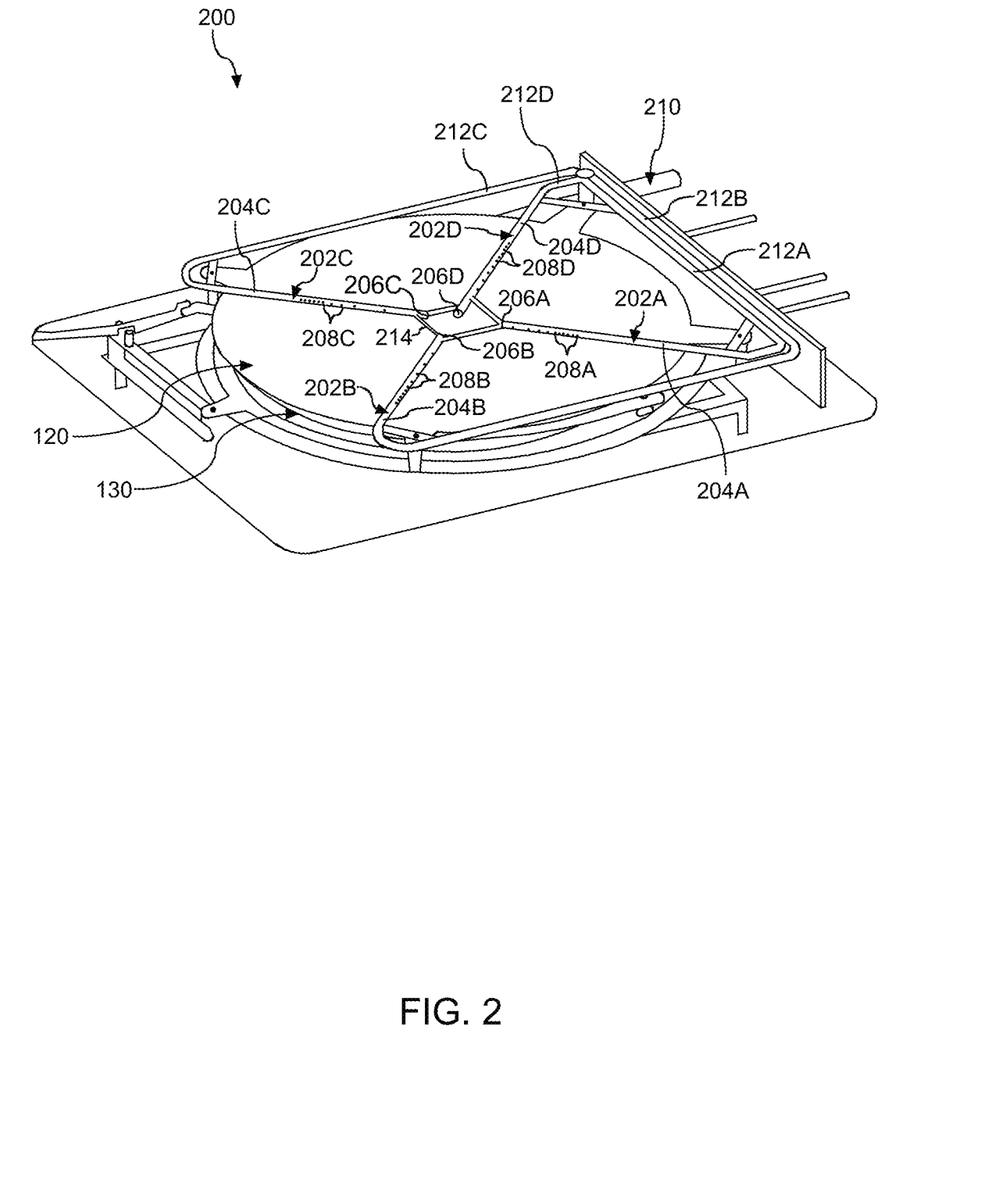
FIG. 2 depicts a perspective view of an example cooling system of a thermal processing system according to example embodiments of the present disclosure.
Figure 3:
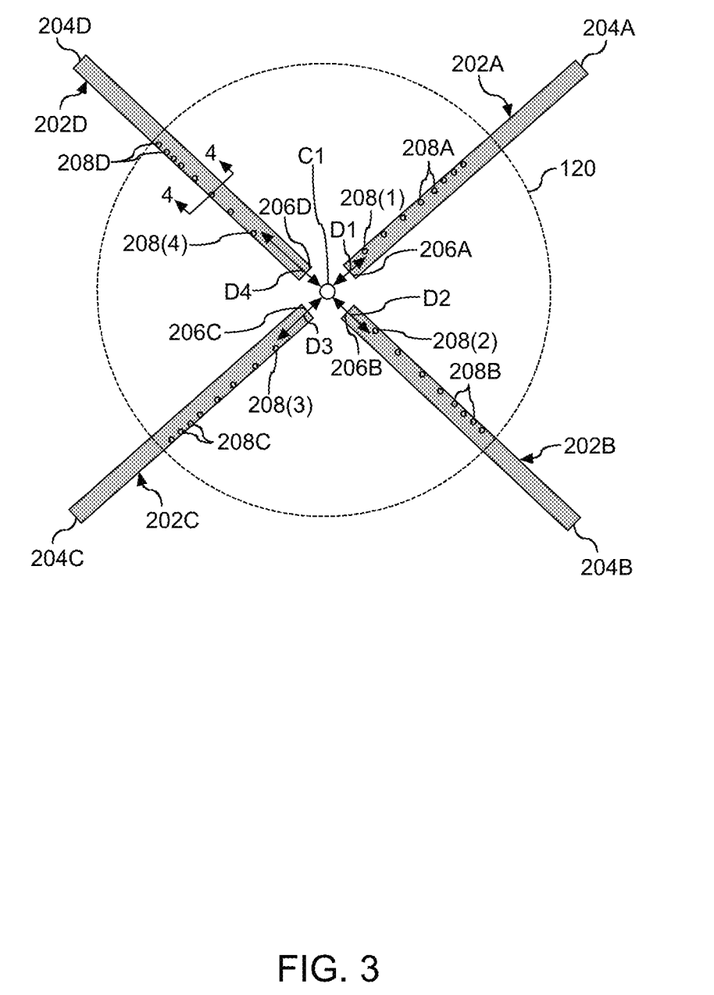
FIG. 3 depicts a bottom-up view of cooling tubes of an example cooling system of a thermal processing system according to example embodiments of the present disclosure.
Figure 4:
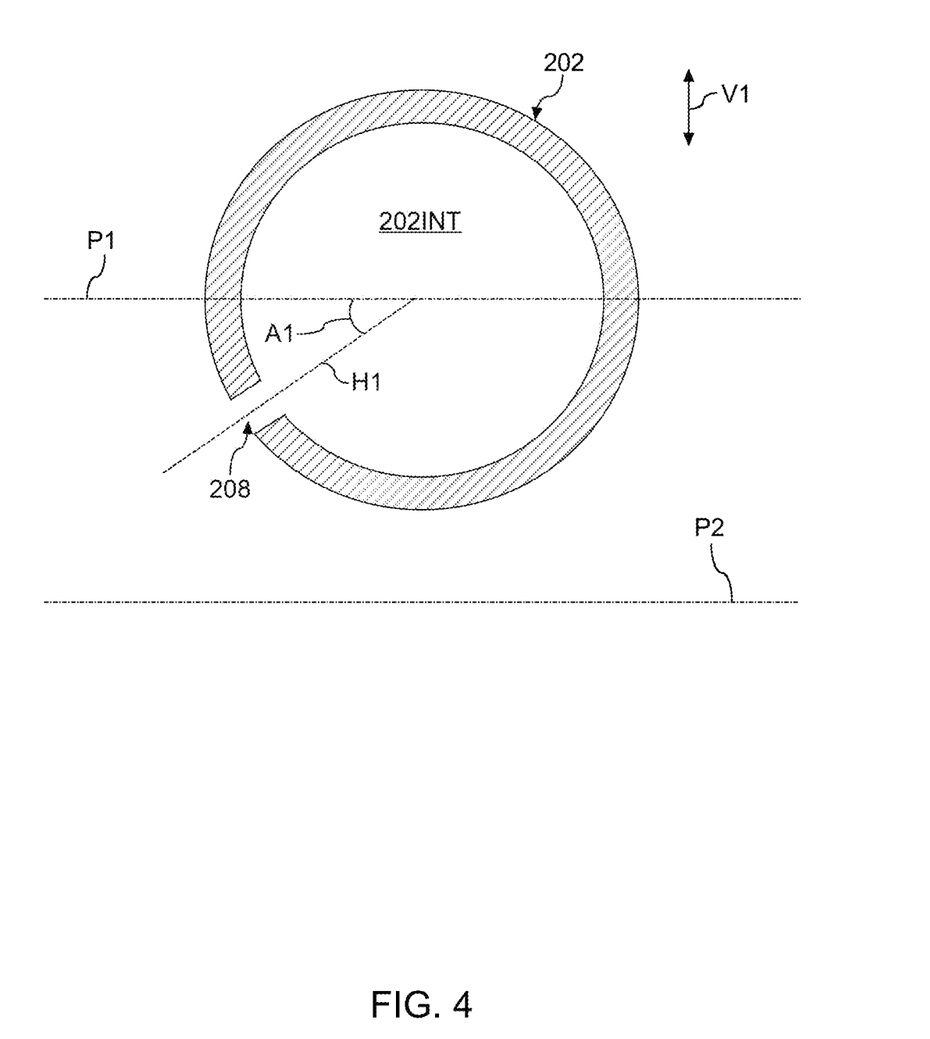
FIG. 4 depicts a cross-sectional view of a cooling tube of an example cooling system of a thermal processing system according to example embodiments of the present disclosure.

Turning now to FIGS. 2-4, example aspects of a cooling system 200 of a thermal processing system 100 are depicted. More particularly, FIG. 2 depicts a perspective view of an example cooling system of a thermal processing system. Further, FIG. 3 depicts a bottom-up view of cooling tubes of an example cooling system of a thermal processing system. Additionally, FIG. 4 depicts a cross-sectional view of a cooling tube of an example cooling system of a thermal processing system.

As shown in FIG. 2, the cooling system 200 comprises a plurality of cooling tubes 202 (e.g., first cooling tube 202A, second cooling tube 202B, third cooling tube 202C, fourth cooling tube 202D) and a gas supply 210. The cooling tubes 202 are disposed in a same cooling plane P1 (FIG. 4). In some embodiments, the cooling plane P1 is parallel to a workpiece plane P2 (FIG. 4) defined by the surface of the workpiece 120 or of the workpiece support 130 (FIG. 1). Each of the cooling tubes 202 extends at least between an inlet end 204 (e.g., inlet ends 204A, 204B, 204C, 204D) and a closed end 206 (e.g., closed ends 206A, 206B, 206C, 206D). Each of the cooling tubes 202 has a plurality of outlet openings or outlets 208 (e.g., outlets 208A, 208B, 208C, 208D) between the inlet and closed ends 204, 206. The inlet ends 204 of the cooling tubes 202 are connected to the gas supply 210 such that cooling gas is supplied from the gas supply 210 into the inlet ends 204 of the cooling tubes 202 and exhausted out of the cooling tubes 202 via the outlet openings 208 towards the workpiece support 130, and thus a workpiece (e.g., workpiece 120) supported thereon. As will be described in greater detail below, in a preferred embodiment, the cooling system 200 has exactly four cooling tubes 202A, 202B, 202C, 202D.

In some instances, the inlet ends 204 of the cooling tubes 202 may be connected to the gas supply 210 via respective supply conduits 212 (e.g., supply conduits 212A, 212B, 212C, 212D) coupled between the gas supply 210 and respective inlet ends 204 of the cooling tubes 202. However, in some instances, the supply conduits 212 are instead integrally formed with the cooling tubes 202 and define the inlet ends 204 of the cooling tubes 202. It should be appreciated that, in some embodiments, the gas supply 210 is coupled to the cooling tubes 202 such that each of the cooling tubes 202 is provided a substantially equal portion of the cooling gas flowing from the gas supply 210.

In one embodiment, the cooling tubes 202 may be configured to at least partially support each other. For instance, the cooling tubes 202 may be coupled together by support members 214 proximate the closed ends 206 of the cooling tubes 202. As will be described below in greater detail, the cooling tubes 202 and the support members 214 may be configured such that the cooling device 200 does not radially overlap a center of the workpiece 120.

Turning now to FIG. 3, the cooling tubes 202 are configured to evenly disperse the cooling gas flowing therethrough across a workpiece. For instance, the cooling tubes 202 may be evenly spaced apart. For example, in embodiments with four cooling tubes, such as in the example embodiment shown, directly adjacent ones of the four cooling tubes 202 are positioned perpendicular to each other. In some embodiments, each of the cooling tubes 202 has the same number of outlet openings 208. Further, in some aspects, the outlet openings 208 have a same cross-sectional area.

Each of the outlet openings 208 of the cooling tubes 202 is radially spaced apart from a center axis Cl of a workpiece (e.g., workpiece 120). Particularly, in some embodiments, each of the outlet openings 208 of the cooling tubes 202 is spaced apart from the center axis Clof the workpiece 120 by a different radial distance. For instance, a radially innermost, first outlet 208(1) of the outlet openings 208A of the first cooling tube 202A is spaced apart from the center axis Cl of the workpiece 120 by a first distance D1, a radially innermost, second outlet 208(2) of the outlet openings 208B of the second cooling tube 202B is spaced apart from the center axis Cl of the workpiece 120 by a second distance D2, a radially innermost, third outlet 208(3) of the outlet openings 208C of the third cooling tube 202C is spaced apart from the center axis Cl of the workpiece 120 by a third distance D3, and a radially innermost, fourth outlet 208(4) of the outlet openings 208D of the fourth cooling tube 202D is spaced apart from the center axis Cl of the workpiece 120 by a fourth distance D4. The second distance D2 is greater than the first distance D1, the third distance D3 is greater than the second distance D2, and the fourth distance D4 is greater than the third distance D3.

In one embodiment, the outlet openings 208 of the plurality of cooling tubes 202 are spaced outwardly from the first outlet 208(1) by increasingly smaller radial distances. As such, the distance between the two radially innermost outlets 208 of a cooling tube 202 is larger than the distance between the two radially outermost outlets 208 of the cooling tube 202. In some embodiments, the spacing between the outlet openings 208 of each cooling tube 202A, 202B, 202C, 202D is the same for all of the cooling tubes 202. In some aspects, the spacing between the outlet openings 208 of the plurality of cooling tubes 202 is configured such that the outlet openings 208 form a spiral pattern. Additionally, in some aspects, the radially outermost outlet openings 208 are at or just beyond an outermost radius of the workpiece 120.

Moreover, as shown in FIG. 3, the cooling tubes 202 may be spaced apart from the center axis Cl of the workpiece 120. For instance, the closed ends 206 of the cooling tubes 202 may be radially spaced apart from the center axis Cl of the workpiece 120. As one or both of the openings 208 and the closed ends 206 of the cooling tubes 202 are spaced apart from the center axis Cl of the workpiece 120, the center portion of the workpiece 120 is prevented from being cooled at a different rate from the remainder of the workpiece 120, for example, due to a higher concentration of the flow of cooling air across the center portion of the workpiece 120 than the outer portion of the workpiece 120.

As shown in FIG. 4, the outlet openings 208 may be formed in the cooling tubes 202 such that the outlet openings 208 direct cooling gas towards the workpiece. For instance, an axis H1 of the outlet openings 208 may be positioned at an angle A1 relative to the cooling plane P1 of the cooling system 200. The angle A1 is generally configured such that the flow of cooling gas from an interior 202INT of a cooling tube 202 is directed at least partially downward along the vertical direction V1 towards the workpiece plane P2. For example, the angle A1 may be between 20 degrees and 90 degrees, between 30 and 70 degrees, between 40 and 50 degrees, 45 degrees, or any other suitable angle.

Additionally, it should be appreciated that, in some embodiments, the cooling tubes 202 are comprised of quartz material. As such, the cooling tubes 202 may be fire polished such that the number of particles generated by the cooling system 200 during an anneal process that may contaminate the workpiece is reduced.

Figure 5:
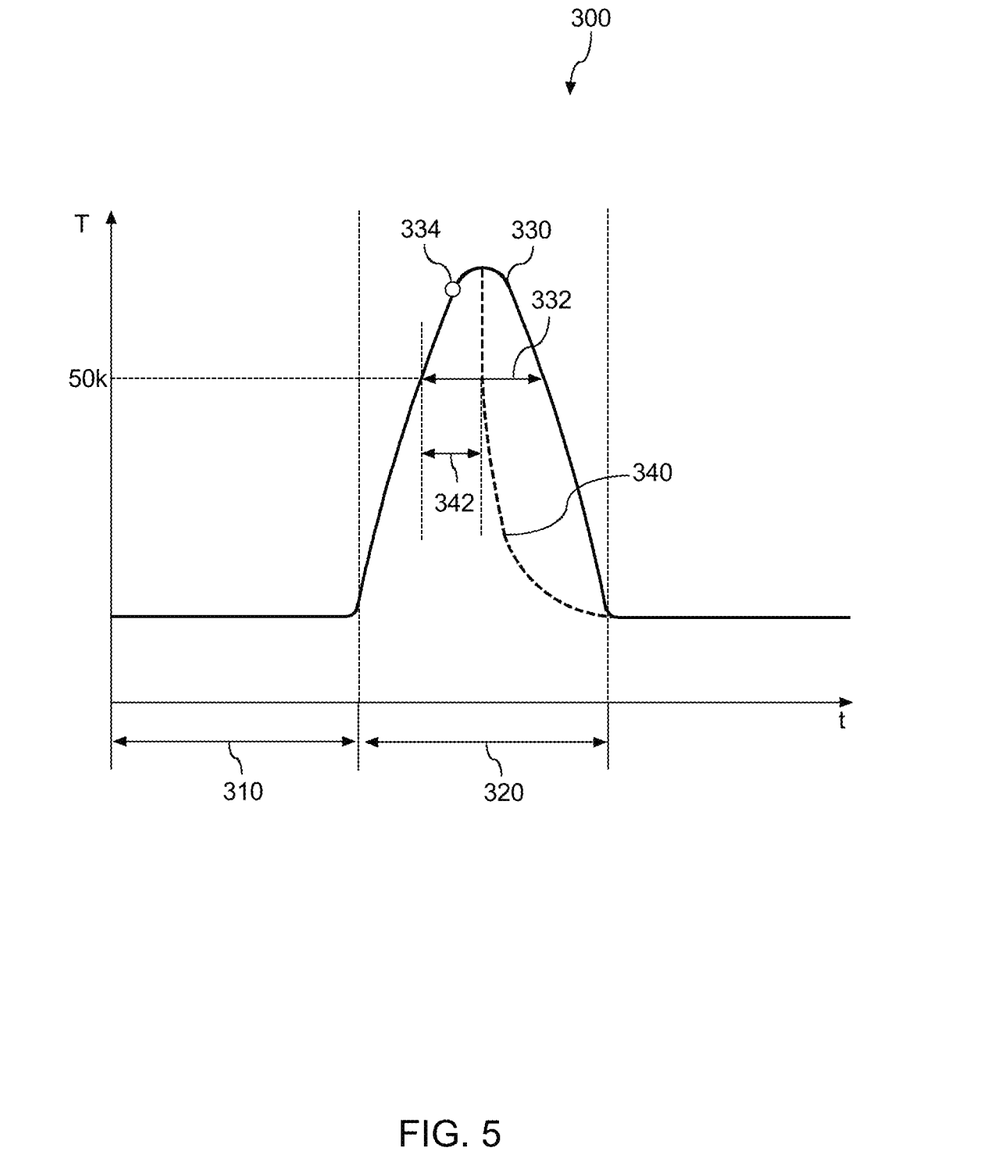
FIG. 5 depicts an example temperature time profile of a thermal processing system according to example embodiments of the present disclosure.

FIG. 5 depicts an example temperature time profile 300 of a thermal processing system 100 according to example embodiments of the present disclosure. As can be seen in FIG. 5, subsequent to a first time period 310, a spike anneal process occurs during a second time period 320. A heating profile 330 (solid-line curve) can be generated by a conventional spike anneal. In the conventional spike anneal, one or more heat sources (e.g., heat sources 150) is controlled to emit light to heat a workpiece while monitoring the temperature of the workpiece relative to a temperature setpoint 334. In one aspect, the temperature setpoint 334 is within about 20% of a peak temperature of the heating profile 340 of the thermal processing system 100. The heat sources may be configured to stop emitting light once the temperature of the workpiece reaches or surpasses the temperature setpoint 334. The conventional spike anneal can have a 50° temperature (e.g., 50K) peak width (t50 peak width) 332 of the heating profile 330. A heating profile 340 (dash-line curve) can be generated by the thermal processing system 100 by controlling the cooling system 200 to begin flowing cooling gas over the workpiece at a rate of 300 slm or greater based at least upon the temperature of the workpiece reaching or surpassing the temperature setpoint 334. For instance, the cooling system 200 may be controlled to begin flowing the cooling gas over the workpiece when the temperature of the workpiece 120 reaches the temperature setpoint 334. Alternatively, the cooling system 200 may be controlled to begin flowing the cooling gas over the workpiece when a second temperature setpoint (not shown) expires, where the second temperature setpoint may be between the first temperature setpoint 334 and the peak desired temperature, or may be less than the first temperature setpoint 334. A t50 peak width 342 of the heating profile 340 of the thermal processing system 100 using the cooling system 200 is less than the t50 peak width 332 of the heating profile 330 of the conventional spike anneal process.

Figure 6:
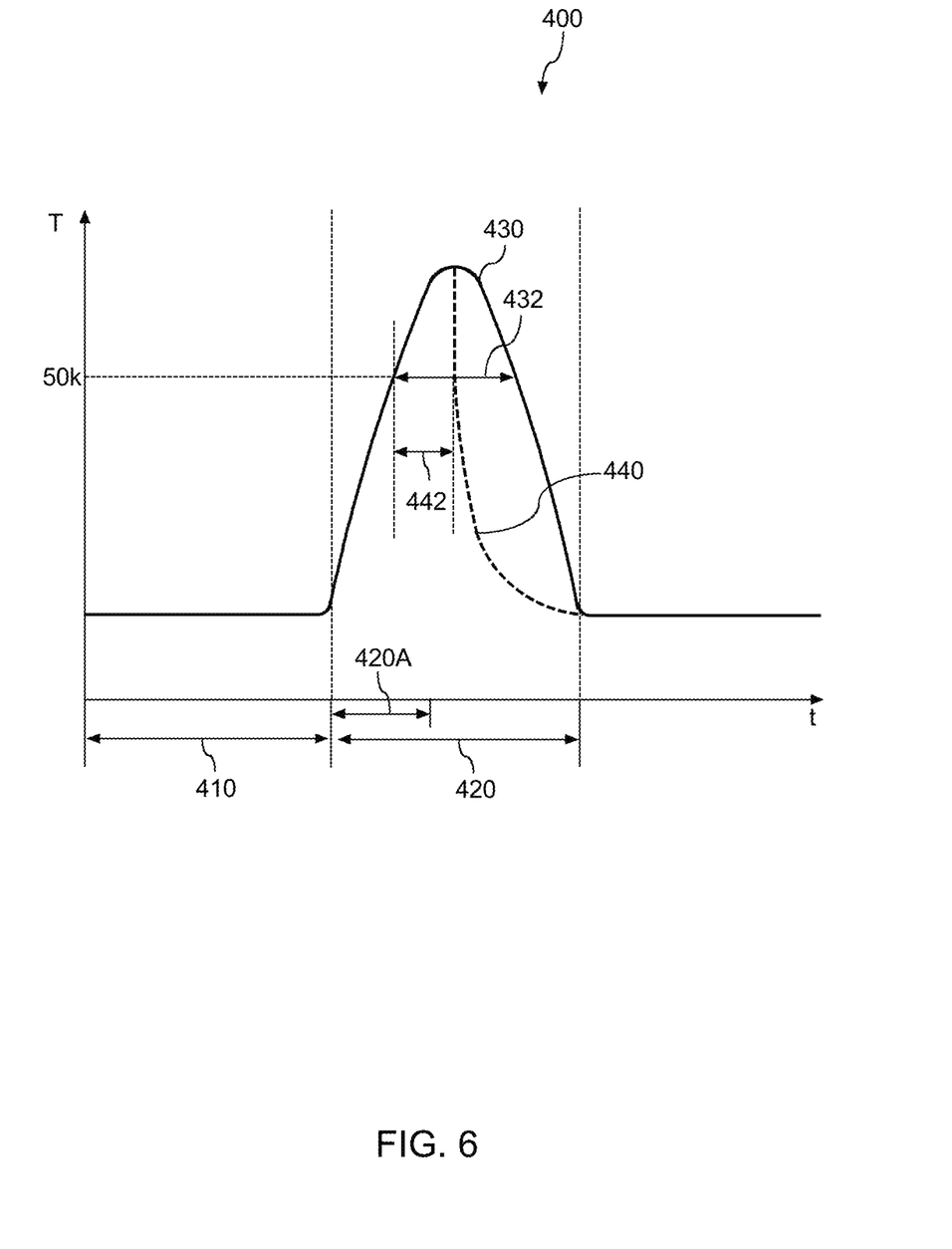
FIG. 6 depicts an example temperature time profile of a thermal processing system according to example embodiments of the present disclosure.

FIG. 6 depicts an example temperature time profile 400 of a thermal processing system 100 according to example embodiments of the present disclosure. As can be seen in FIG. 6, subsequent to a first time period 410, a spike anneal process occurs during a second time period 420. A heating profile 430 (solid-line curve) can be generated by a conventional spike anneal. In the conventional spike anneal, one or more heat sources (e.g., heat sources 150) is controlled to emit light to heat a workpiece for a predetermined time interval 420A of the second time period 420A corresponding to the workpiece being able to reach the peak temperature. In one aspect, the predetermined time interval 420A is in a range of about 5 milliseconds to about 100 milliseconds. The conventional spike anneal can have a 50° temperature (e.g., 50K) peak width (t50 peak width) 432 of the heating profile 430. A heating profile 440 (dash-line curve) can be generated by the thermal processing system 100 by controlling the cooling system 200 to begin flowing cooling gas over the workpiece at a rate of 300 slm or greater based at least upon the expiration of the predetermined time interval 420A of operating the heat sources. For instance, the cooling system 200 may be controlled to begin flowing the cooling gas over the workpiece when the time interval 420A expires. Alternatively, the cooling system 200 may be controlled to begin flowing the cooling gas over the workpiece when a second time interval (not shown) expires, where the second time interval may begin at the expiration of the first time interval 420A and be in a range of about 5 milliseconds to about 100 milliseconds. A t50 peak width 442 of the heating profile 340 of the thermal processing system 100 using the cooling system 200 is less than the t50 peak width 432 of the heating profile 430 of the conventional spike anneal process.

Figure 7:
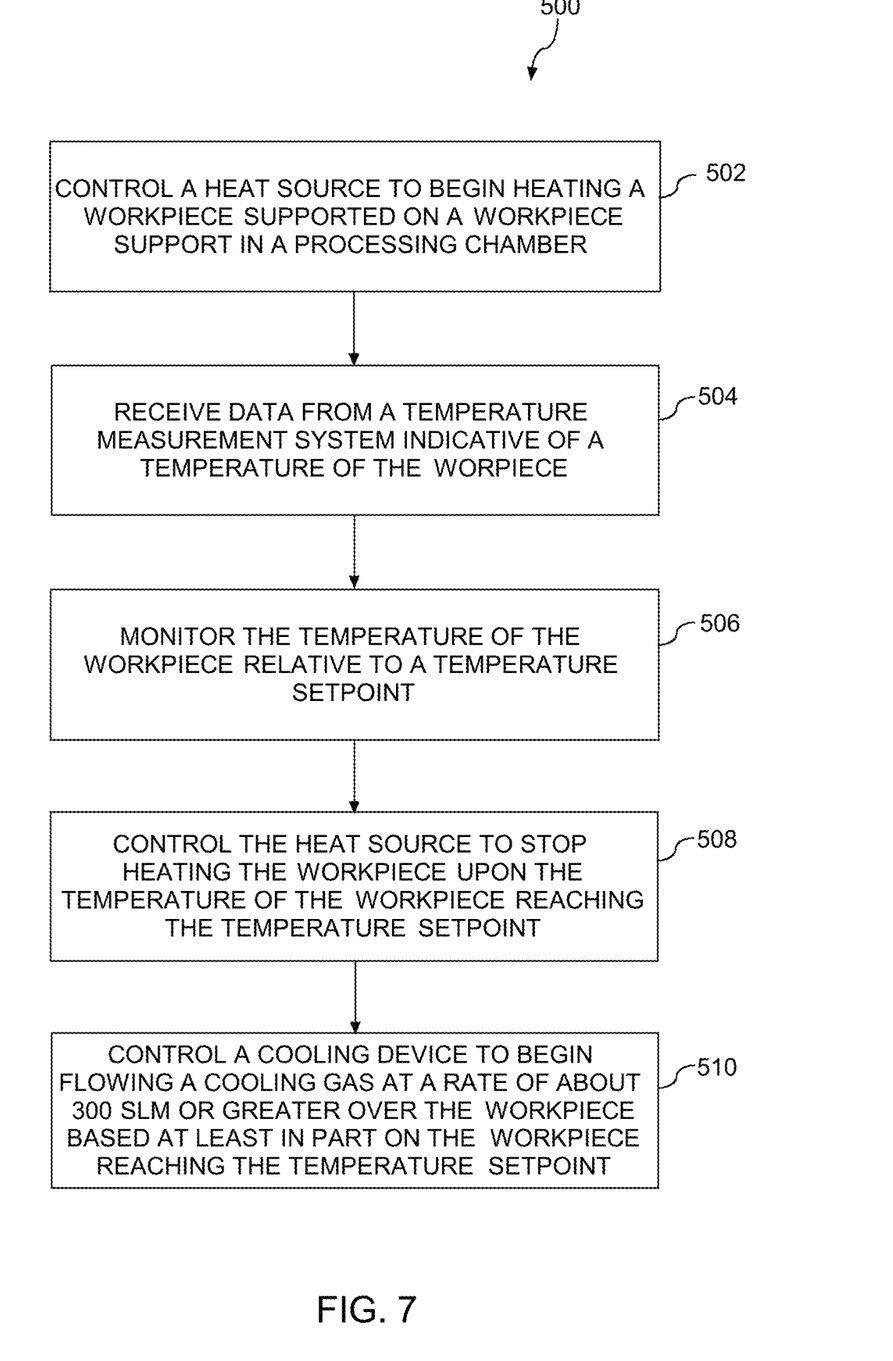
FIG. 7 depicts a flow diagram of an example method according to example embodiments of the present disclosure.

FIG. 7 depicts a flow diagram of an example method (500) according to example embodiments of the present disclosure. The method (500) will be discussed with reference to the thermal processing system 100 of FIG. 1 by way of example. The method (500) can be implemented in any suitable plasma processing apparatus. FIG. 7 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (502), the method 500 can include controlling a heat source to begin heating a workpiece supported on a workpiece support within a processing chamber. For instance, a controller 190 of the thermal processing system 100 can control a heat source(s) 150 to begin heating (i.e., emitting light towards) a workpiece 120 supported on a workpiece support 130 within a processing chamber 105.

At (504), the method 500 can further include receiving data from a temperature measurement system indicative of a temperature of a workpiece during a spike anneal process. For instance, the thermal processing system 100 can include one or more temperature sensors 180 which can generate and communicate data indicative of a temperature of the workpiece 120.

Furthermore, at (506), the method 500 can include monitoring the temperature of the workpiece relative to a temperature setpoint. For instance, a controller 190 of the thermal processing system 100 can access data indicative of a temperature setpoint (e.g., temperature setpoint 334 described in FIG. 9). The temperature setpoint can be within about 20% of a peak temperature of a heating profile associated with the spike anneal heating profile.

Moreover, at (508), the method 500 can include controlling the heat source to stop heating the workpiece based at least in part on the temperature of the workpiece reaching the temperature setpoint. For instance, when a temperature of the workpiece 120 reaches or exceeds the temperature setpoint, the controller 190 can control the heat source(s) 150 to stop heating (i.e., emitting light towards) the workpiece 120.

Additionally, at (510), the method can include controlling a cooling system to begin flowing a cooling gas at a rate of about 300 slm or greater over the workpiece based at least in part on the temperature of the workpiece reaching the temperature setpoint. For instance, when a temperature of the workpiece 120 reaches or exceeds the temperature setpoint, the controller 190 can control a cooling system 200 of the thermal processing system to begin flowing a cooling gas at a rate of about 300 slm or greater over the workpiece 120 to reduce a t50 peak width of the workpiece.

Figure 8:
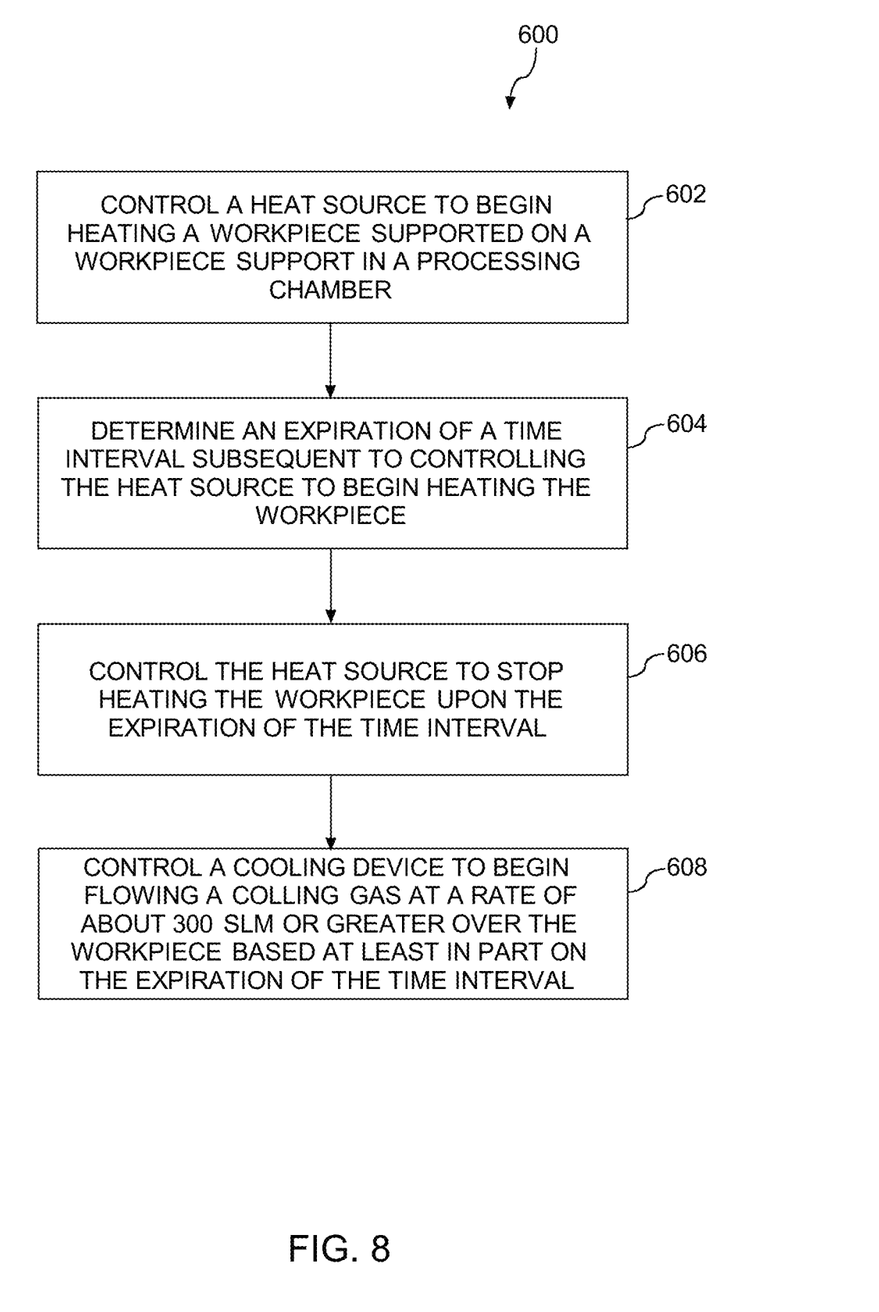
FIG. 8 depicts a flow diagram of another example method according to example embodiments of the disclosure.

FIG. 8 depicts a flow diagram of an example method (600) according to example embodiments of the present disclosure. The method (600) will be discussed with reference to the thermal processing system 100 of FIG. 1 by way of example. The method (600) can be implemented in any suitable plasma processing apparatus. FIG. 8 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (602), the method 600 can include controlling a heat source to begin heating a workpiece supported on a workpiece support within a processing chamber. For instance, a controller 190 of the thermal processing system 100 can control a heat source(s) 150 to begin heating (i.e., emitting light towards) a workpiece 120 supported on a workpiece support 130 within a processing chamber 105.

Further, at (604), the method 600 can include determining expiration of a time interval subsequent to controlling the heat source to begin heating the workpiece. For instance, the controller 190 of the thermal processing system 100 can determine expiration of a time interval (e.g., the time interval 420A described with reference to FIG. 10), such as a time interval in a range of about 5 milliseconds to about 100 milliseconds.

Moreover, at (606), the method 600 can include upon expiration of the time interval, controlling the heat source to stop heating the workpiece. For instance, the controller 190 of the thermal processing system 100 can control the heat source(s) 150 to stop heating (i.e., emitting light towards) the workpiece 120 when the time interval expires.

Additionally, at (608), the method 600 can include controlling a cooling system to begin flowing a cooling gas at a rate of about 300 slm or greater over the workpiece based at least in part on the time interval expiring. For instance, when the time interval expires, the controller 190 can control a cooling system 200 of the thermal processing system begin flowing a cooling gas at a rate of about 300 slm or greater over the workpiece 120 to reduce a t50 peak width of the workpiece.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A thermal processing system for performing rapid thermal processing of semiconductor workpieces, comprising:
   a processing chamber;
   a workpiece support configured to support a workpiece within the processing chamber, a workpiece plane defined by the workpiece;
   a heat source configured to heat the workpiece;
   a temperature measurement system configured to generate data indicative of a temperature of the workpiece; and
   a cooling system configured to flow a cooling gas over the workpiece supported on the workpiece support, the cooling system comprising a plurality of cooling tubes arranged in a cooling plane, the cooling plane is parallel to the workpiece plane, wherein directly adjacent ones of the plurality of cooling tubes are positioned perpendicular to each other, each cooling tube of the plurality of cooling tubes having an inlet opening and a plurality of radially-spaced outlet openings, wherein a radially innermost outlet opening of each of the plurality of radially-spaced outlet openings of the plurality of cooling tubes is spaced out at a different radial distance from a central axis of the workpiece support.

2. The system of claim 1, wherein the cooling system further comprises a gas supply coupled to the inlet openings of the plurality of cooling tubes to provide the cooling gas from a gas source through the plurality of cooling tubes and out the plurality of radially-spaced outlet openings of the plurality of cooling tubes, and
   wherein the thermal processing system further comprises a controller configured to control the heat source and the cooling system based at least in part on the data indicative of the temperature of the workpiece to provide a flow of cooling gas into the processing chamber at a rate of about 300 slm or greater to reduce a t50 peak width of a workpiece during a thermal process.

3. The system of claim 1, wherein the plurality of cooling tubes comprises four cooling tubes, where directly adjacent ones of the four cooling tubes are positioned perpendicular to each other.

4. The system of claim 1, wherein an axis of each of the plurality of radially-spaced outlet openings of the plurality of cooling tubes is angled relative to the cooling plane towards the workpiece plane.

5. The system of claim 1, wherein the radial distance between adjacent ones of the plurality of radially-spaced outlet openings of each of the plurality of cooling tubes decreases with increasing radial distance from the central axis of the workpiece.

6. The system of claim 1, wherein the plurality of cooling tubes are comprised of quartz material.

7. The system of claim 1, wherein the plurality of cooling tubes are spaced apart from a central axis of the workpiece.

8. A cooling system for a rapid thermal processing system, comprising:
   four cooling tubes arranged in a cooling plane, each cooling tube extending radially towards a central axis, each cooling tube having an inlet opening and a plurality of radially-spaced outlet openings,
   wherein directly adjacent ones of the four cooling tubes are positioned perpendicular to each other; and
   a gas supply coupled to the inlet openings of the four cooling tubes to provide a cooling gas from a gas source through the four cooling tubes and out the plurality of radially-spaced outlet openings of the four cooling tubes,
   wherein a radially innermost outlet opening of each of the plurality of radially-spaced outlet openings of the four cooling tubes is spaced out at a different radial distance from the central axis.

9. The system of claim 8, wherein the plurality of radially-spaced outlet openings of the four cooling tubes are radially-spaced apart from the central axis.

10. The system of claim 8, wherein the radial distance between adjacent ones of the plurality of radially-spaced outlet openings of each of the four cooling tubes decreases with increasing radial distance from the central axis.

11. The system of claim 8, wherein each of the plurality of radially-spaced outlet openings of the four cooling tubes has a same cross-sectional area.

12. The system of claim 8, wherein the four cooling tubes are comprised of quartz material.

13. The system of claim 8, wherein an axis of each of the plurality of radially-spaced outlet openings of the four cooling tubes is angled relative to the cooling plane.

* * * * *